INVENTOR.
MAX E. PETERSON
BY Henry K. Woodward
ATTORNEY

INVENTOR.
MAX E. PETERSON
BY Henry K. Woodward
ATTORNEY

PHASE LOCKED FREQUENCY SOURCE WITH AUTOMATIC SEARCH CIRCUIT

Filed Sept. 4, 1968 4 Sheets-Sheet 3

INVENTOR.
MAX E. PETERSON
BY Henry K. Woodward
ATTORNEY

PHASE LOCKED FREQUENCY SOURCE WITH AUTOMATIC SEARCH CIRCUIT

Filed Sept. 4, 1968 4 Sheets-Sheet 4

INVENTOR.
MAX E. PETERSON
BY Henry K. Woodward
ATTORNEY

United States Patent Office 3,535,651
Patented Oct. 20, 1970

3,535,651

PHASE LOCKED FREQUENCY SOURCE WITH AUTOMATIC SEARCH CIRCUIT

Max E. Peterson, Richardson, Tex., assignor to Collins Radio Company, Cedar Rapids, Iowa, a corporation of Iowa Filed Sept. 4, 1968, Ser. No. 757,291
Int. Cl. H03b 3/04
U.S. Cl. 331—4 2 Claims

ABSTRACT OF THE DISCLOSURE

A phase locked frequency source including a variable frequency oscillator which is phase locked to a reference frequency oscillator. Should phase lock be lost, search circuit means are provided to automatically force the variable frequency oscillator to scan a relatively wide frequency range until phase lock is again achieved.

Figure 1:
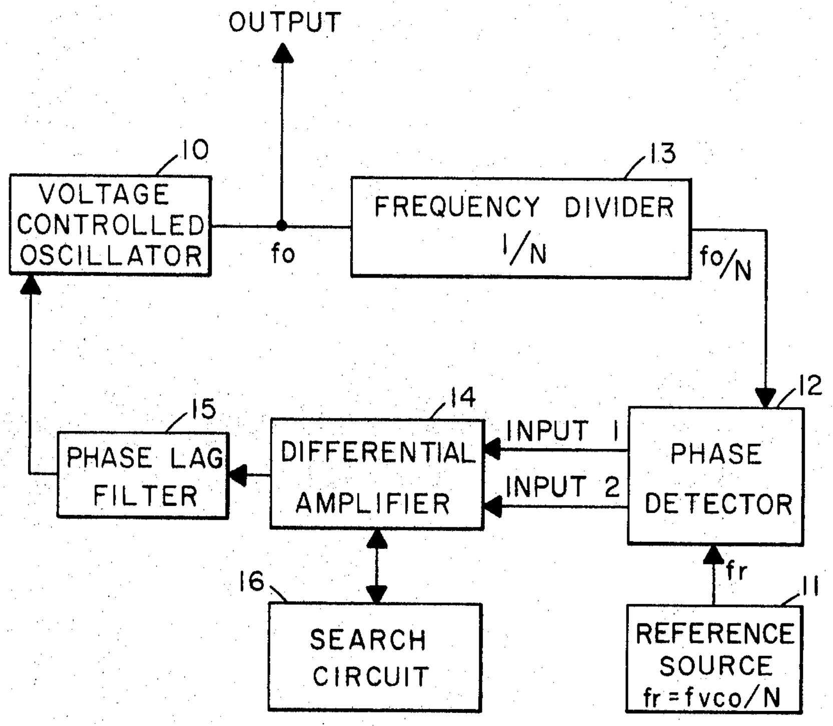

This invention relates to electrical oscillators, and in particular to phase locked oscillators having circuit means for improving the capture range of the oscillator relative to a reference frequency should the oscillator lose phase lock.

A considerable reduction in the wideband noise level of stable frequency sources, particularly sources operating in the microwave region, can be realized by operating the frequency source in a phase locked feedback loop. When operating in such a phase locked loop, a variable frequency source, usually a voltage controlled oscillator, is phase locked to the relatively stable but noisy reference source. The main advantage gained in reducing noise level is an increase in the usable modulation bandwidth.

In a typical phase locked system, the voltage controlled oscillator has a tuning range sufficiently large to compensate for any frequency drift which the voltage controlled oscillator may exhibit. Preferably, a frequency divider is operably connected to the voltage controlled oscillator and provides a stepped-down frequency to a phase detector which compares the stepped-down frequency to the reference frequency, thereby providing a higher modulation index, hence, an increase in loading efficiency.

The phase detector generates a differential voltage which is proportional to the phase difference of the reference signal and VCO signal. This voltage is then amplified, filtered, and applied to control the voltage controlled oscillator.

Since the frequency response of the phase detector and DC amplifier are relatively high, a phase-lag type of filter is preferably employed between the differentail amplifier and the voltage controlled oscillator to reduce the close loop bandwith and improve stability. Unfortunately, reducing the closed loop bandwith also reduces the system capture range, that is, the frequency range over which the voltage controlled oscillator can become phase locked to the reference signal after some disturbance such as a power failure forces the loop out of phase lock.

An object of this invention is an improved controlled frequency source.

Another object of the invention is a phase locked oscillator with means for improving the capture range of the oscillator.

Still another object of the invention is an automatic search circuit for a phase locked frequency source.

These and other objects and features of the invention will be apparent from the following description and appended claims.

Briefly, in accordance with the invention a controlled or phase locked frequency source includes signal comparing means such as a phase detector for comparing the source frequency with a reference frequency, and producing an analogous differential voltage with respect thereto. The differential voltage is amplified, filtered and applied to control the frequency source. Should the frequency source lose lock with the reference frequency, a search circuit is provided to automatically force the frequency source to scan a relatively wide frequency range until phase lock is again achieved.

Figure 2:
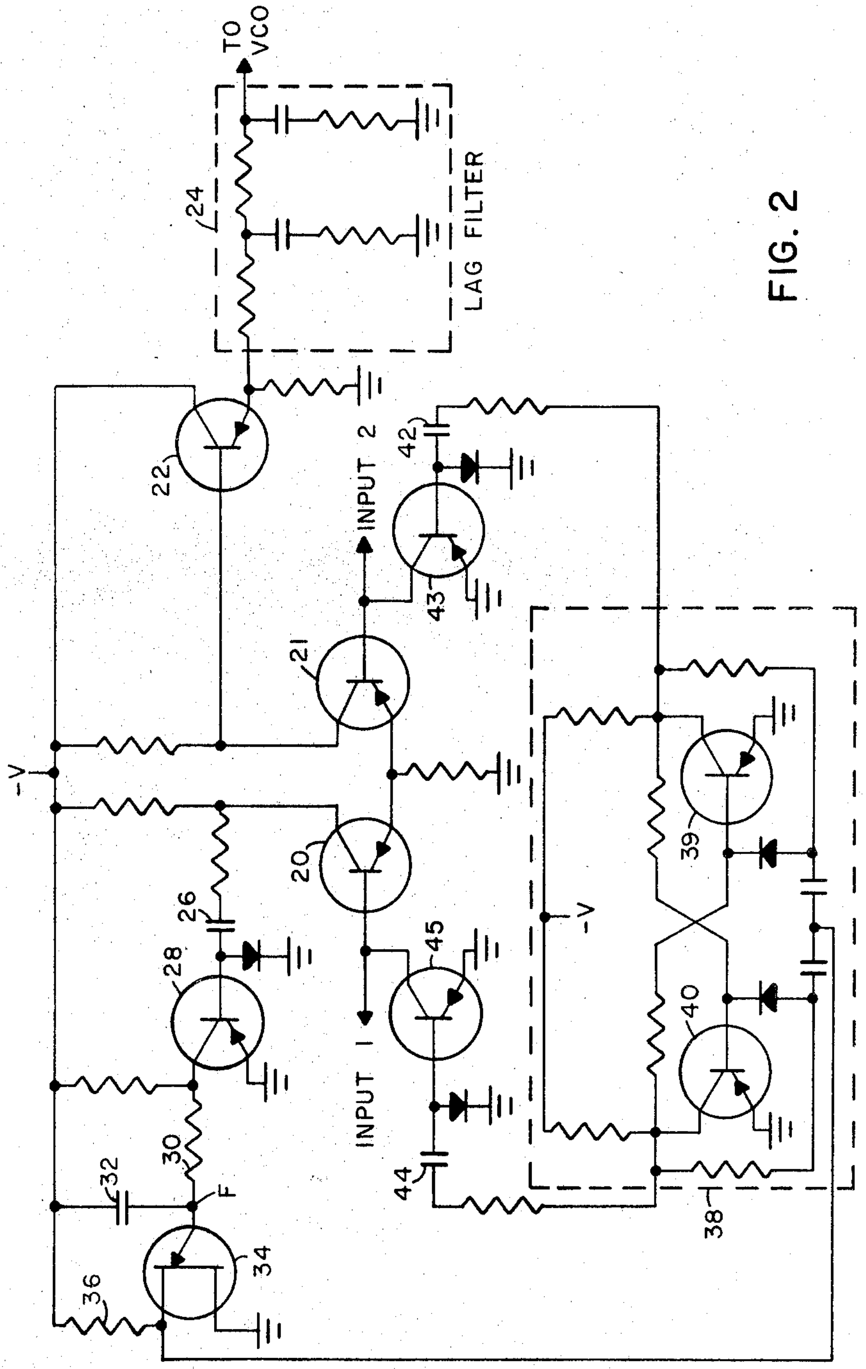

The invention will be more fully understood from the following detailed description and appended claims when taken with the drawing, in which:

FIG. 1 is a functional block diagram of a frequency source in accordance with the invention, FIG. 2 is a schematic of a portion of the circuit of FIG. 1, FIG. 3A–3J are representations of voltages at various points in the circuit of FIG. 2.

Referring now to the drawings, and in particular to FIG. 1, a block diagram of a frequency source in accordance with the invention is illustrated. The output of the frequency source is derived from a voltage controlled oscillator 10. The frequency, $f_o$, of oscillator 10 is controlled with respect to reference frequency, $f_r$, derived from a reference source 11 by comparing $f_o$ with $f_r$ in a phase detector 12, To provide a higher modulation index, $f_o$ is passed through a frequency divider 13 which divides $f_o$ by an integer N to provide the phase detector with a stepped down frequency $f_{o/N}$.

Phase detector 12 produces a differential voltage which is proportional to the phase difference of $f_o$ and $f_r$, and the differential voltage is passed to a differential amplifier 14. The amplified voltage from amplifier 14 is then fed back to control oscillator 10.

To improve the circuit stability, the output of amplifier 14 is first passed through a phase lag filter 15 which reduces the closed loop frequency response. While the filtering action does improve the circuit stability, the reduced bandwith also reduces the capture range should the voltage controlled oscillator 10 lose phase lock with the reference source 11. To compensate for this, search circuit 16 is provided to cooperatively function with amplifier 14 and increase the capture range for the voltage controlled oscillator 10.

Operation of the search circuit 16 is best described with reference to the schematic circuit diagram of FIG. 2 and the voltages at various points in the circuit of FIG. 2 which are illustrated in FIGS. 3A–3J. Consider now FIG. 2 which includes the differential amplifier comprising transistors 20 and 21 which in normal phase lock operation receive base control voltages at input 1 and input 2 from the phase detector 12 of FIG. 1. The control voltage for the voltage controlled oscillator is taken at the collector of transistor 21 and passed through an emitter follower circuit comprising transistor 22 to the phase lag filter shown generally at 24. Typically, the two section filter has over 30 db of attenuation of frequencies above 100 hertz. Consequently, when the loop is out of lock and an AC voltage appears at the collector of transistor 21 (as opposed to a slowly fluctuating DC voltage which is normally received from the phase detector) filter 24 passes only a small control voltage to the varactor of the voltage controlled oscillator and thereby limits the frequency excursion of the oscillator. Since the voltage controlled oscillator may need to scan a relatively wide frequency range to again effect phase lock, the control voltage will have to vary over a comparably large voltage range.

Figure 3A:
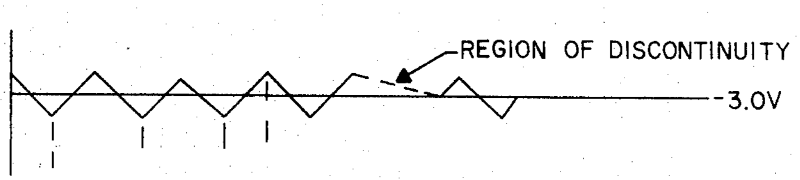
Figure 3B:
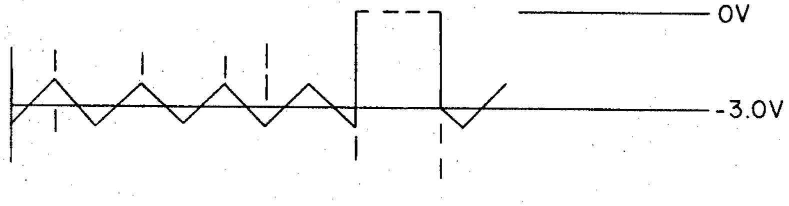
Figure 3C:
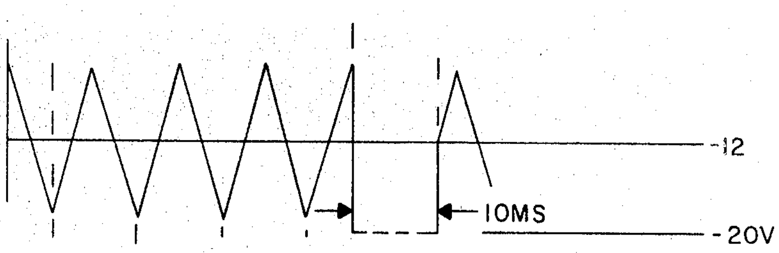
Figure 3D:
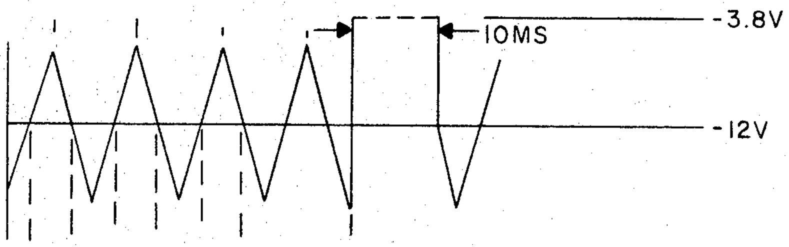
Figure 3E:
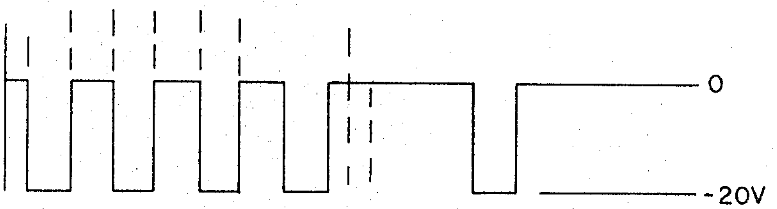
Figure 3F:
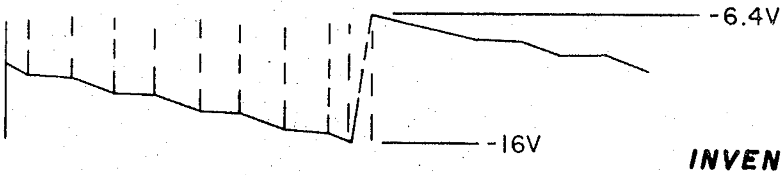
Figure 3G:
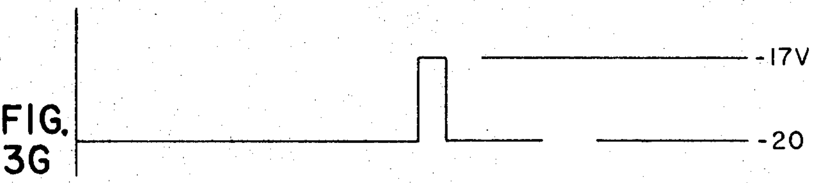
Figure 3H:
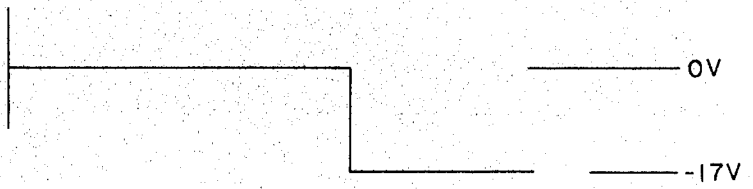
Figure 3I:
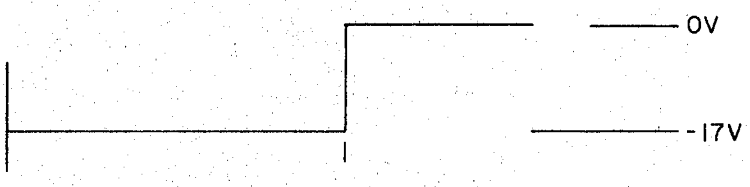

When phase lock is lost, the phase detector provides complementary AC voltages through inputs 1 and 2 to transistors 20 and 21, respectively, of the differential amplifier. Typically, the complementary voltage may vary about a minus 3 volts potential, as shown. The voltages at inputs 1 and 2 are shown in FIGS. 3A and 3B, respectively, and the amplified voltages appearing at the collectors of transistors 20 and 21 are shown in FIGS. 3D and 3C, respectively. The frequency of the AC voltage may be 500 kilohertz to one megahertz. The AC voltage at the collector of transistor 20 is transmitted by capacitor 26 as pulses to the base of transistor 28. The periodic pulsing of transistor 28 produces a square wave voltage at the collector of transistor 28 as illustrated in FIG. 3E. The pulsed voltage appearing at the collector of transistor 28 provides a charging current through resistor 30 to capacitor 32 and incrementally charges the capacitor as illustrated in FIG. 3F. When a firing potential is developed across capacitor 32, the relaxation oscillator comprising transistor 34 discharges capacitor 32 and generates a positive going pulse across resistor 36 as illustrated in FIG. 3G. The positive going pulse of FIG. 3G is then used to trigger a binary flip-flop shown generally at 38 and comprising transistors 39 and 40. Transistors 39 and 40 change state with each input pulse with the voltages at the transistor collectors varying as illustrated in FIGS. 3H and 3I, respectively. Assuming that the collector of transistor 39 is at logic "zero" (e.g. zero volt), the next input pulse will switch the collector of transistor 39 to a logic "1" (negative potential) and the collector of transistor 40 will switch to a logic "0," as shown in FIGS. 3H and 3I.

Figure 3J:
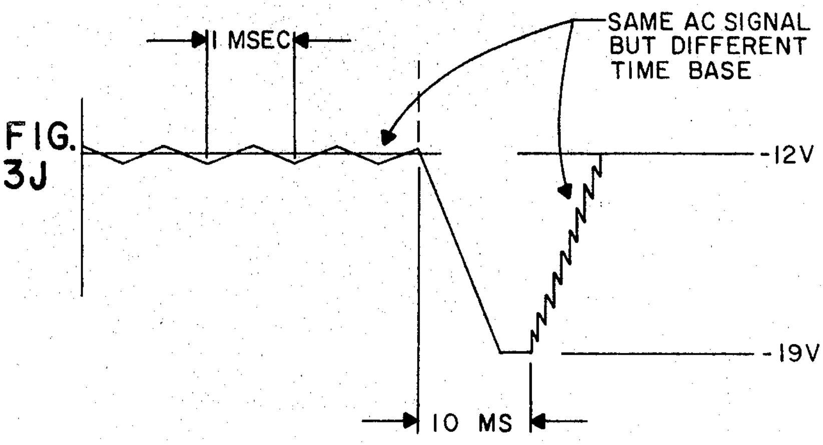

As the collector of transistor 39 switches to a negative potential, a negative pulse is transmitted by capacitor 42 to the base of PNP transistor 43 driving transistor 43 into saturation and pulling the base of transistor 21 to ground. As the base of transistor 21 is held at ground potential the collector of transistor 21 is held near the miximum negative potential which is transmitted through emitter follower transistor 22 to the lag phase filter 24. The negative potential is maintained sufficiently long to be transmitted through filter 24 to the voltage controlled oscillator as illustrated in FIG. 3J. It will be noted that the time scale in FIG. 3J is adjusted for illustration purposes. Thus, the tuning voltage varies over a wider range as the maximum negative voltage (e.g. —19 volts) is developed across filter 24 and then begins to decay through the emitter follower resistor.

Should the loop fail to lock before capacitor 32 again charges to the firing potential of unijunction transistor 34, a second trigger pulse is generated for flip-flop 38, and transistors 39 and 40 again change state. The negative going potential on the collector of transistor 40 is transmitted through capacitor 44 and drives transistor 45 into saturation which, in turn, pulls the base of transistor 20 to ground potential and forces the collector voltage of transistor 21 to drop to near ground potential. The potential on the collector of transistor 21 is again transmitted through emitter follower 22 to phase lag filter 24 and the voltage controlled oscillator tuning voltage is driven to near ground potential. Again, the tuning voltage decays through the emitter follower resistor, thus allowing the voltage controlled oscillator to scan a frequency range.

Only two pulses from the unijunction relaxation oscillator are required to alternately sweep the VCO tuning voltage across the maximum potential range. Obviously, the trigger repetition rate for flip-flop 38 should not exceed the sweep rate for filter 24. The desired trigger repetition rate is established by the values of resistor 30, capacitor 32, and unijunction transistor 34.

It will be appreciated that other transistor types can be utilized with a change of supply voltage polarity. Further, while the invention has been described with reference to a specific embodiment, the description is illustrative and is not to be construed as limiting the scope of the invention. Various modifications and changes may occur to those skilled in the art without departing from the spirit and scope of the invention as defined by the appended claims.

What is claimed is:

1. A controlled frequency source comprising:
(a) a variable frequency oscillator,
(b) a reference frequency oscillator,
(c) frequency comparing means for comparing the signal from said variable frequency oscillator to the signal from said reference frequency oscillator and generating a voltage analogous to said comparison,
(d) means including a differential amplifier for applying said voltage to said variable frequency oscillator to thereby control the frequency of said variable frequency oscillator with respect to the frequency of said reference frequency oscillator, and
(e) means responsive to a loss of control of said frequency of said variable frequency oscillator to automatically force said variable frequency oscillator to scan a frequency range until control is again achieved, said means including a bistable flip-flop operably connected to force the output of said differential amplifier to a voltage extreme momentarily following a transition of states of said flip-flop, a relaxation oscillator for triggering said flip-flop, and charging means for developing a firing potential for said relaxation oscillator in response to the presence of an AC voltage at the output of said differential amplifier.

2. A phase locked frequency source comprising a variable frequency oscillator, a reference frequency oscillator, phase detector means for comparing the signal from said variable frequency oscillator to the signal from said reference frequency oscillator and generating a voltage analogous to said comparison, differential amplifier means for amplifying said voltage, means including a phase lag filter for transmitting the amplified voltage to said variable frequency oscillator to control the frequency of said variable frequency oscillator, and means responsive to a loss of phase lock for forcing said variable frequency oscillator to scan a frequency range until phase lock is again effected, said means responsive including a bistable flip-flop operably connected to force the output of said differential amplifier to a voltage extreme momentarily following a transition of states of said flip-flop, a relaxation oscillator for triggering said flip-flop, and charging means for developing a firing potential for said relaxation oscillator in response to the presence of an AC voltage at the output of said differential amplifier.

References Cited

UNITED STATES PATENTS 3,293,560 12/1966 Tschannen ............ 331—4
3,321,712 5/1967 Frisch et al. ......... 331—17 X ROY LAKE, Primary Examiner S. H. GRIMM, Assistant Examiner U.S. Cl. X.R.

331—17, 25